United States Patent [19]

Matsumi

[11] Patent Number: 5,145,810

[45] Date of Patent: Sep. 8, 1992

[54] FABRICATION PROCESS OF SEMICONDUCTOR PRESSURE SENSOR FOR SENSING PRESSURE APPLIED

[75] Inventor: Koji Matsumi, Tokyo, Japan

[73] Assignee: Oki Electric Industry Co., Ltd., Tokyo, Japan

[21] Appl. No.: 722,558

[22] Filed: Jun. 25, 1991

[30] Foreign Application Priority Data

Jun. 25, 1990 [JP] Japan .................. 2-164161

[51] Int. Cl.[5] ............. H01L 21/265; G01L 9/06
[52] U.S. Cl. ............................ 437/228; 437/225; 437/249; 437/901; 73/727
[58] Field of Search ............. 437/7, 225, 228, 233, 437/249, 901, 921; 357/26; 73/726, 727; 156/644, 651

[56] References Cited

U.S. PATENT DOCUMENTS

| | | | |
|---|---|---|---|
| 3,357,801 | 12/1967 | Jones, Jr. ............................ | 437/7 |
| 4,523,964 | 6/1985 | Wilmer et al. ..................... | 437/7 |
| 4,618,397 | 10/1986 | Shimizu et al. ..................... | 437/7 |
| 4,808,549 | 2/1989 | Mikkor et al. ..................... | 437/901 |

FOREIGN PATENT DOCUMENTS

| | | |
|---|---|---|
| 158633 | 10/1980 | Japan . |
| 0206137 | 12/1983 | Japan . |
| 0004136 | 1/1984 | Japan . |
| 0072177 | 4/1987 | Japan . |
| 0283073 | 11/1988 | Japan . |
| 0031470 | 2/1990 | Japan . |

OTHER PUBLICATIONS

"One-chip Integrated Pressure Sensor", T. IEE Japan, 109-C(12), 855-861, (1989) by S. Sugiyama et al.
"Yudentai Bunri Gijutsu (Dielectric Isolation Technology)", T. Usui et al., Oki Denki Kenkyu Kaihatsu (R & D at Oki Electric Industry Co., Ltd.), 51(1-122), 71-78 (Mar., 1984).

Primary Examiner—Tom Thomas
Attorney, Agent, or Firm—Wenderoth, Lind & Ponack

[57] ABSTRACT

A fabrication process of a semiconductor pressure sensor is described. A first recess and a second recess, which is deeper than the first recess, are formed in a first surface of a semiconductor substrate. A reinforcement layer is formed on the entire first surface. A second surface of the semiconductor substrate is then polished until a part of the second recess appears on a side of the second surface. After that, a resistance element is formed in the second surface at a region opposing the first recess.

22 Claims, 10 Drawing Sheets

FABRICATION PROCESS OF SEMICONDUCTOR PRESSURE SENSOR FOR SENSING PRESSURE APPLIED

BACKGROUND OF THE INVENTION

1) Field of the Invention

The present invention relates to a semiconductor pressure sensor, and specifically to a semiconductor pressure sensor having a thin diaphragm. This invention is also concerned with a fabrication process thereof, which makes use of an alignment mark.

2) Description of the Related Art

Semiconductor pressure sensors are used in various apparatuses such as automobiles and measuring instruments, since their performance including sensitivity is excellent despite of their reduced size and weight.

A conventional pressure sensor, as described by S. Sugiyama et al. in the article "One-Chip Integrated Pressure Sensor", T.IEE Japan, 109-C(12), 855–861 (1989), has a piezo resistance element formed over a diaphragm so that the piezo resistance element can sense pressures applied thereto in terms of variations in the resistivity thereof.

SUMMARY OF THE INVENTION

An object of the present invention is to provide a semiconductor pressure sensor having a thin diaphragm. The thickness of the diaphragm is determined by the depth of an alignment mark.

According to a process of the present invention for the fabrication of a semiconductor pressure sensor, a first recess and a second recess are formed in a first surface of a semiconductor substrate having the first surface and a second surface. The first recess is deeper than the second recess. A reinforcement layer for the semiconductor substrate is formed on the first surface in which the first and second recesses are contained. The second surface is polished until a part of the first recess appears on a side of the second surface. A resistance element is then formed on the second surface at a region opposing the second recess.

According to another process of the present invention for the fabrication of a semiconductor pressure sensor, a first recess and a second recess are formed in a first surface of a semiconductor substrate having the first surface and a second surface. The first recess has a predetermined width and is deeper than the second recess. The depth of the first recess is determined by the predetermined width. A reinforcement layer for the semiconductor substrate is formed on the first surface in which the first and second recesses are contained. The second surface is polished until a part of the first recess appears on a side of the second surface. A resistance element is then formed on the second surface at a region opposing the second recess.

DETAILED DESCRIPTION OF THE PREFERRED EMBODIMENTS

The fabrication process according to the first embodiment of the present invention will now be described with reference to FIG. 1(A) to FIG. 1(G).

Figure 1A:
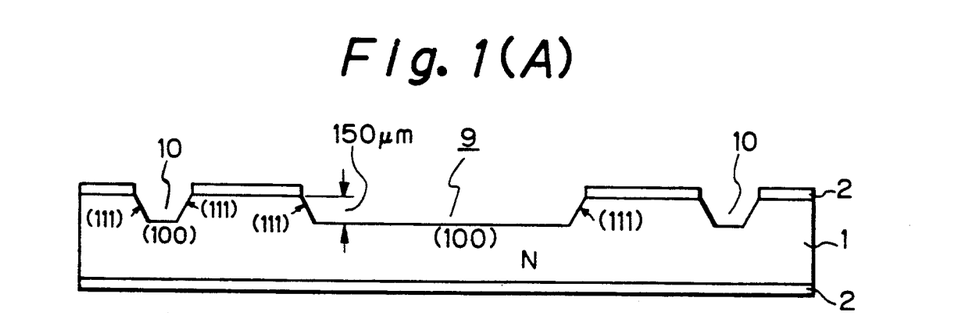
FIG. 1(A) to FIG. 1(G) are cross-sectional views showing various steps of a fabrication process according to a first embodiment of the present invention.

As is illustrated in FIG. 1(A), an n-type silicon substrate 1 having a diameter of 4 inches, a thickness of 500 $\mu$m and a (100) crystal plane is used. A thermally oxidized film 2 of about 5000 Å is formed on each side of the substrate 1. The thermally oxidized film 2, which is located on the upper side as viewed in the drawing, is selectively removed by a photolithoetching process at a diaphragm-forming region and also at the region of an alignment mark which is subsequently used upon formation of a diffused resistance pattern. First silicon etching is then conducted with an anisotropic alkaline etchant containing KOH as a principal component. Silicon which has been exposed by the first etching is etched further to a depth of 150 $\mu$m or so, whereby recesses 9,10 are formed for the formation of a diaphragm and the alignment mark, respectively. By the anisotropic etching, a (111) plane appears on a side wall of each of the recesses 9,10.

Figure 1B:
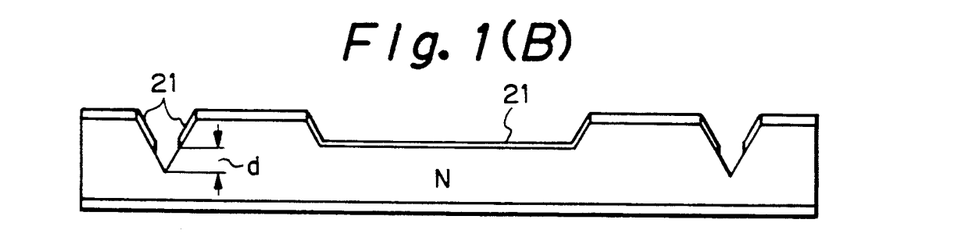

Referring next to FIG. 1(B), the silicon surface exposed on the substrate 1 is thermally oxidized again so that an oxide film 21 of about 2000 Å in thickness is formed.

Photolithoetching is again performed to selectively remove only the oxide film 21 only at the bottom of the recess 10. Second silicon etching is thereafter conducted in a manner similar to the first silicon etching described above. As a result, the (100) plane in the recess 10 is eliminated so that a V-shaped recess whose wall is formed of (111) plane alone is formed. The etohing of silicon is therefore substantially terminated, whereby the alignment mark is completed as designated at symbol 10A.

Figure 2:
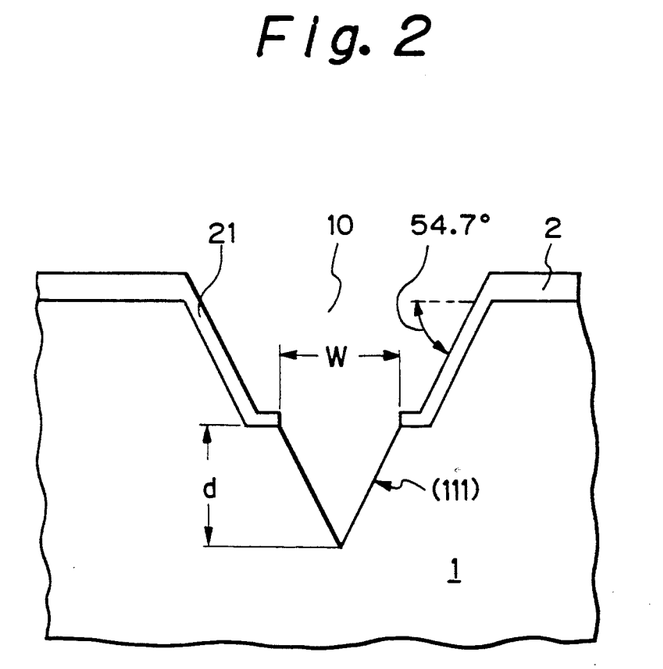
FIG. 2 is an enlarged cross-sectional view of an alignment mark and its vicinity area.

Here, the alignment mark 10A formed as described above will be described in detail with reference to FIG. 2 in which the alignment mark 10A is depicted on an enlarged scale. Assume that the width of the recess 10 formed by the first silicon etching is W when the oxide film 21 in the bottom of the recess 10 has been selectively removed. The following simple, geometrical relationship is then established between the width W and the depth d of the recess 10 formed as a result of the second silicon etching:

$$d = W/2\tan 54.7° \simeq 0.7W$$

["Yudentai Bunri Gijutsu (Dielectric Isolation Technology)", T.Usui et al., "OKI DENKI KENKYU KAIHATSU (R & D at OKI ELECTRIC INDUSTRY CO., LTD.)", 51(1-122), 81–74 (March, 1984)].

Once the dimension of the width W is determined, the depth d can therefore be easily determined. When the width W is 50 $\mu$m for example, the recess is formed with the depth d of 35 $\mu$m.

The above relationship exists for the following reasons. Namely, there is a substantially large etching sensibility between (III) plane and (100) plane. At the time of completion of the etching of the (100) plane, the etching of the recess has been practically completed so that the depth d of the recess is determined.

Figure 1C:
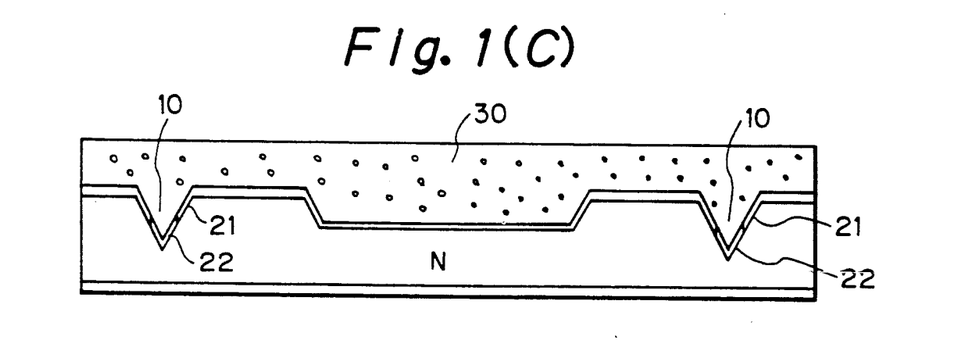

Reference is next had to FIG. 1(C). An oxide film 22 is formed again on the bottom wall of the V-shaped recess, at which bottom wall silicon is exposed. A polysilicon layer 30 is then formed to a thickness of about 300 μm by a CVD (Chemical Vapor Deposition) process on the surface of the substrate 1. The CVD process makes use of the hydrogen reduction reaction of $SiH_2Cl_2$. The growth rate is controlled at approximately 2–5 μm/min.

Figure 1D:
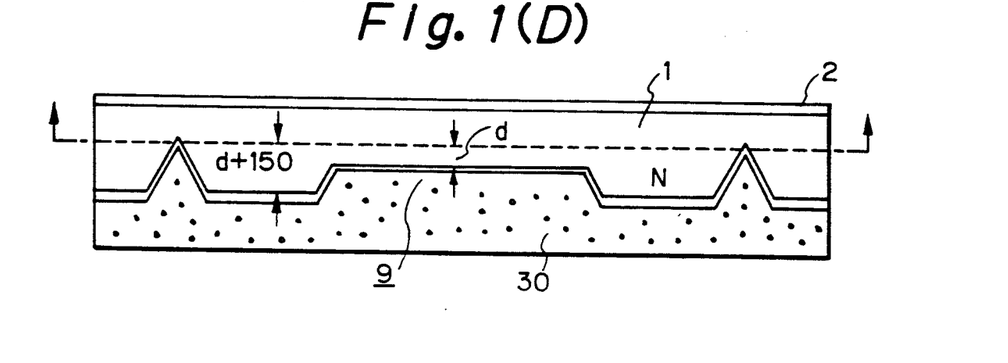

As is illustrated in FIG. 1(D), a rear surface of the substrate 1 on which the polysilicon layer 30 has been formed is then polished off to the depth indicated by a broken line in the drawing, namely, until a part of the V-shaped alignment mark 10A appears. This polishing can be carried out, for example, by the process disclosed on page 74 of the "OKI DENKI KENKYU KAIHATSU", 51(1-122) referred to above. This process is useful in the fabrication of dielectric isolation substrates or monocrystalline silicon substrates, in which a series of steps such as formation of a reference plane, removal of monocrystalline silicon and wafer polishing are conducted successively. As a result, a monocrystalline crystal plane having similar crystallinity to silicon substrates can be formed. After the polishing step, the thickness of the substrate 1 is d (=35 μm) as shown in FIG. 1(D). At other regions, the thickness of the substrate is d+150 μm=185 μm.

Figure 1E:
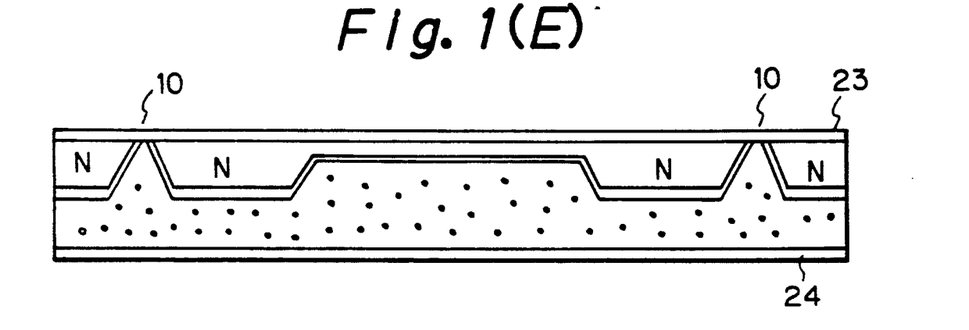

Next, as is depicted in FIG. 1(E), a thermally oxidized film 23 is formed to a thickness of about 3000 Å on the thus-polished surface of the substrate 1. At the same time, a thermally oxidized film 24 is also formed on the side of the polysilicon layer.

Figure 1F:
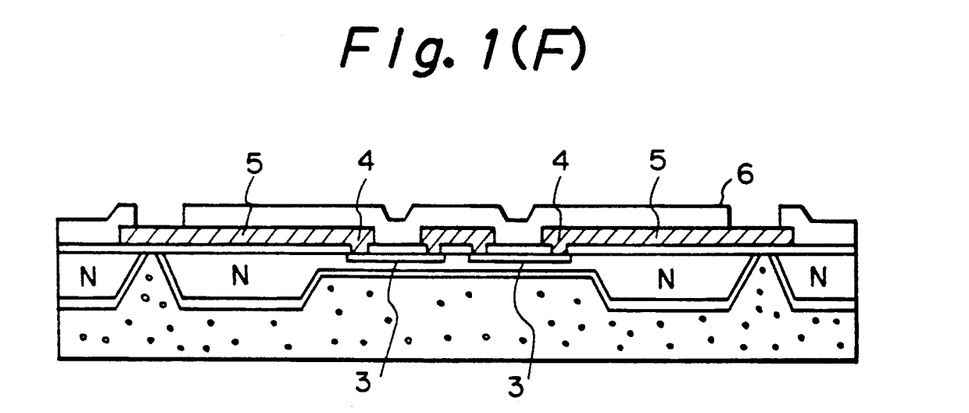

Reference is next made to FIG. 1(F). A diffused resistance layer 3 forming a piezo resistance element is formed on the side of the monocrystalline surface of the substrate. Contact windows are then opened, followed by the successive formation of an Al interconnection and a passivation film 6. Here, the pattern formation of the diffused resistance layer 3 is conducted using the alignment mark 10A exposed in the monocrystalline surface of the substrate. Positional alignment is therefore conducted on the side of the surface. The diffused resistance layer 3 can therefore be precisely arranged at a predetermined position over the diaphragm 9A.

Figure 1G:
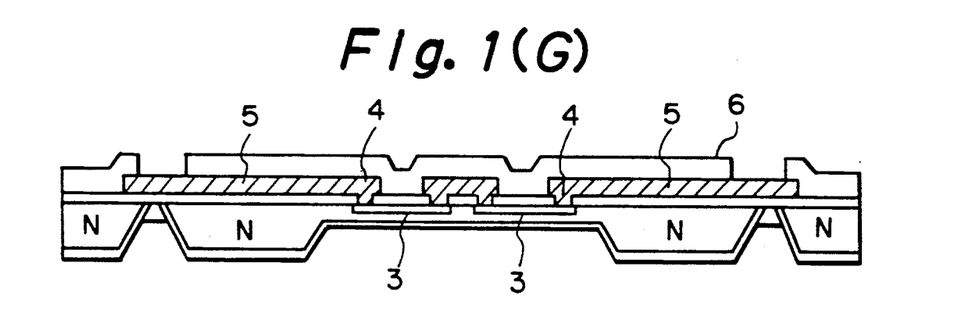

As shown in FIG. 1(G), a resist resin or wax is coated on the surface of the substrate, in which surface the elements have been formed. Using the wax as a mask, the polysilicon layer 30 on the back surface of the substrate is removed with the aforementioned alkaline etchant until the polysilicon in the recess 9 is eliminated. A pressure sensor chip has now been completed.

A silica glass substrate may be bonded to the surface of the substrate for the protection of the surface.

In the step shown in FIG. 1(G), the etching of the silicon layer 30 does not proceed beyond the thermally oxidized film 2, 21, 22 so that the silicon substrate is not etched. The thickness of the diaphragm 9 is therefore the same as the depth d of the recess obtained by the second silicon etching upon formation of the alignment mark 10A. In the illustrated embodiment, the depth of the recess is 35 μm.

In the second embodiment of the present invention, an alignment mark is formed on a grid line of a chip. As has been described above in connection with the first embodiment, a recess for the formation of the alignment mark is etched further subsequent to the formation of a recess which is to be used for the formation of a diaphragm. Accordingly, the dimension L of the completed alignment mark can be expressed as follows:

$$L < 2D \tan 54.7° = D/0.7$$

where D is the thickness of the substrate at a portion which serves as a base for the diaphragm. If D=185 μm, L must be either equal to or greater than 265 μm (L<265 μm). The region where the alignment mark is formed therefore becomes significantly large. When an alignment mark is formed in each chip, the alignment mark occupies a substantial area so that the yield of chips per unit area of substrate is reduced.

Figure 3A:
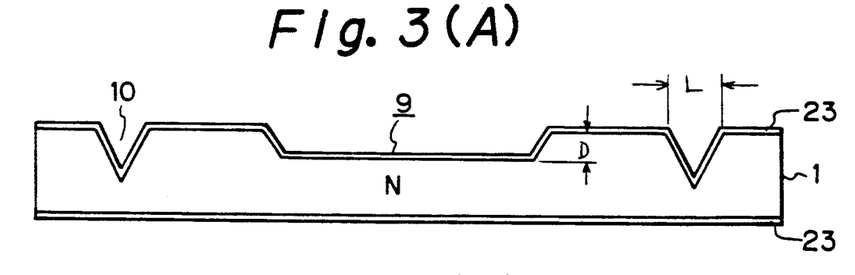
FIG. 3(A) to FIG. 3(C) are cross-sectional views showing some steps of a fabrication process according to a second embodiment of the present invention.
Figure 3B:
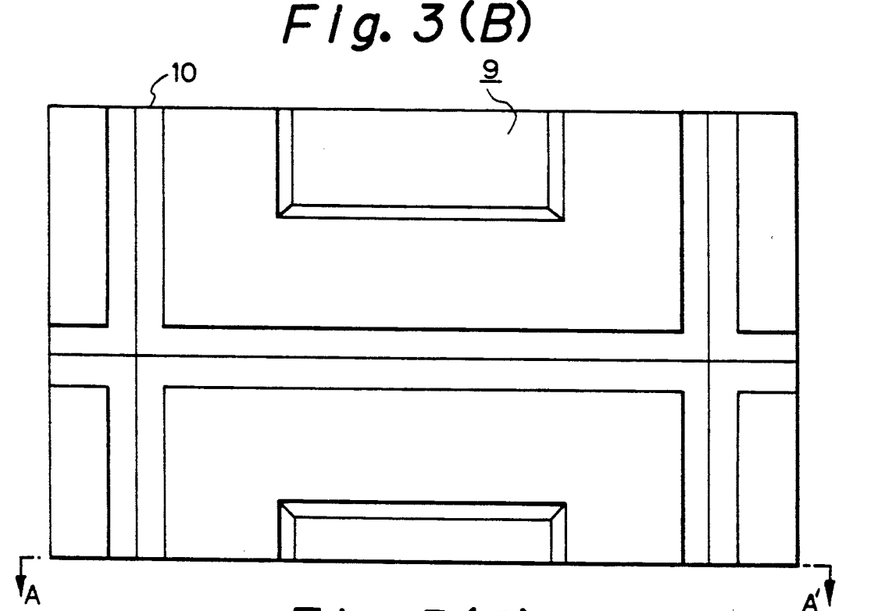
Figure 3C:
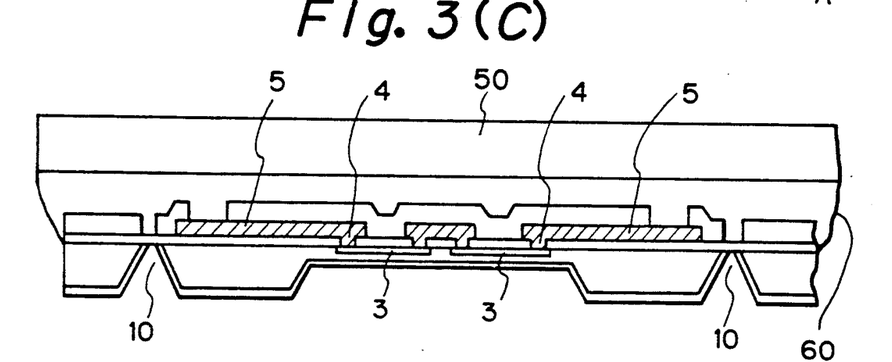

The second embodiment in which the above-described drawback has been improved is illustrated in FIG. 3(A) to FIG. 3(C). Referring first to FIG. 3(A), an alignment mark is formed along the entire length of each grid line. Similarly to the first embodiment, second silicon etching is conducted to form a recess 10 which is to be employed for the formation of the alignment mark. Designated at numeral 23 are thermally oxidized films. Numeral 1 indicates an n-type Si substrate. FIG. 3(B) is a plan view illustrating an upper surface of the substrate. Recesses 10 and their corresponding grid lines are simultaneously formed. A cross-sectional view taken in the direction of arrows III(C)–III(C) is shown in FIG. 3(A). Subsequent steps are the same as the corresponding steps in the first embodiment so that their description is omitted herein. A silica glass substrate 50 is bonded with wax 60 to the substrate shown in FIG. 3(C) and containing the elements formed therein. The polysilicon layer on the back surface is thereafter removed. At this point, the oxide film 23 still remains in a bottom part of each V-shaped alignment mark. The thickness of the oxide film 23 is however as thin as 1 μm or less so that the oxide film 23 is not strong enough to connect the individual chips.

In the second embodiment, the alignment marks are formed on the respective grid lines which are adapted to divide the chips. This arrangement can obviate the reduction in the yield of chips due to the areas occupied by the alignment marks. In addition, mechanical scribing by a dicing machine has been rendered unnecessary so that chipping and/or cracking of chips can be reduced. Further, each piezo resistance element can be protected from the influence of mechanical strain which would otherwise be applied upon scribing.

According to the third embodiment of the present invention, not only an oxide film but also a nitride film are used as insulating films. The additional use of the nitride film has made it possible to further improve the protection of each diaphragm portion from contamination by the external atmosphere.

The fabrication process according to the third embodiment of the present invention will next be described with reference to FIG. 4(A) to FIG. 4(I).

Figure 4A:
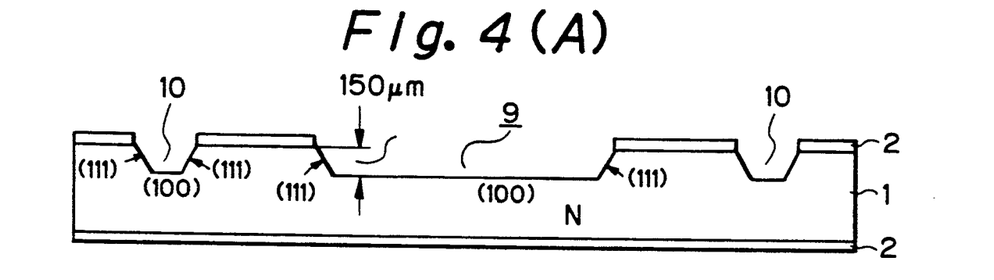
FIG. 4(A) to FIG. 4(I) are cross-sectional views depicting various steps of a fabrication process according to a third embodiment of the present invention.

FIG. 4(A) shows exactly the same step as the corresponding step of the first embodiment, which is illustrated in FIG. 1(A). Namely, an oxide film 2 is formed on each side of a substrate 1. Recesses 9, 10 are then formed by an etching process. These recesses 9, 10 are used for the formation of a diaphragm and an alignment mark, respectively.

Figure 4B:
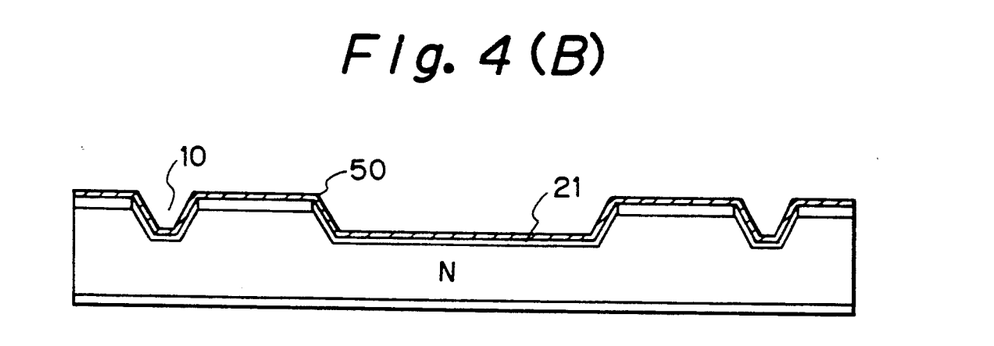

As is depicted in FIG. 4(B), a silicon surface exposed on the substrate 1 is next subjected to thermal oxidation again so that a thermally oxidized film 21 of about 2000

Å in thickness is formed. In addition, a nitride film (Si₃N₄) of about 500 Å is formed on the entire surface.

Figure 4C:
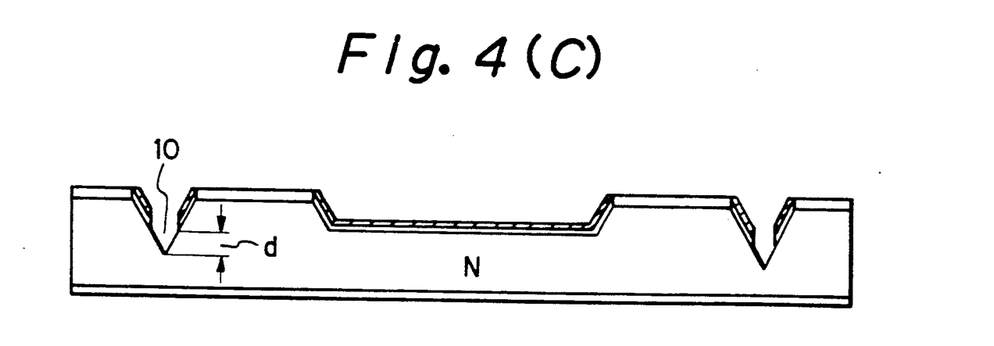
Figure 4D:
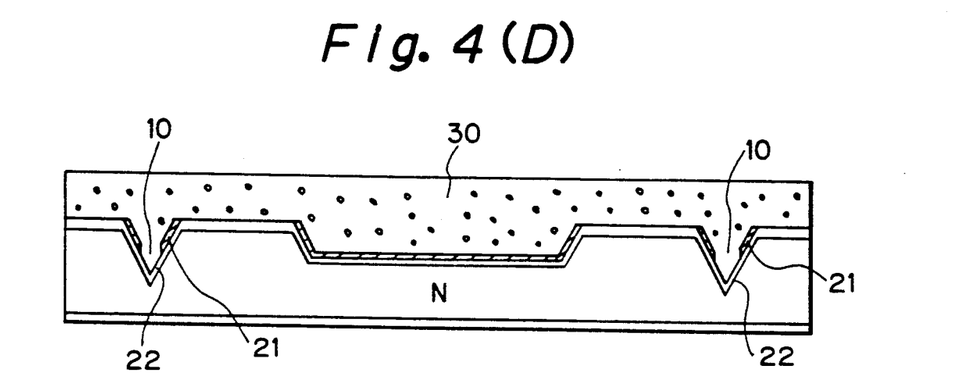
Figure 4E:
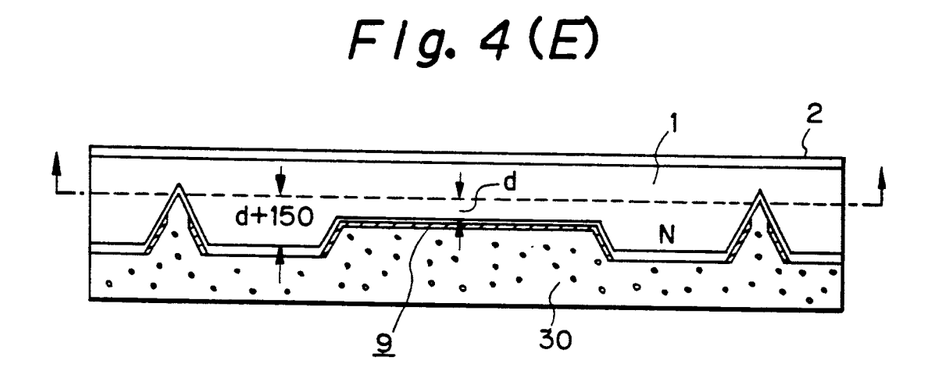

Referring next to FIG. 4(C), the nitride film 50 is selectively etched by a known photolithoetching process so that the nitride film 50 is allowed to remain on entire walls of the recess 9 and on a side wall of the recess 10. Using the thus-etched nitride film 50 as a mask, the oxide film 21 on the bottom of the recess 10 is etched off. Concurrently with this, the thick oxide film 2 is also etched. Since the thickness of the oxide film 2 is as large as 6000 Å or more, the remaining oxide film 2 has a thickness of about 4000 ÅA. Second silicon etching is then conducted as described above. As a result, the (100) plane of the recess 10 is eliminated so that the V-shaped recess 10 has (111) plane only.

Figure 4F:
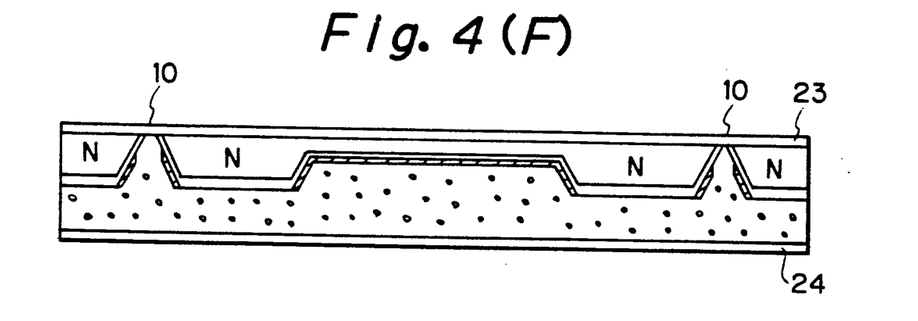
Figure 4G:
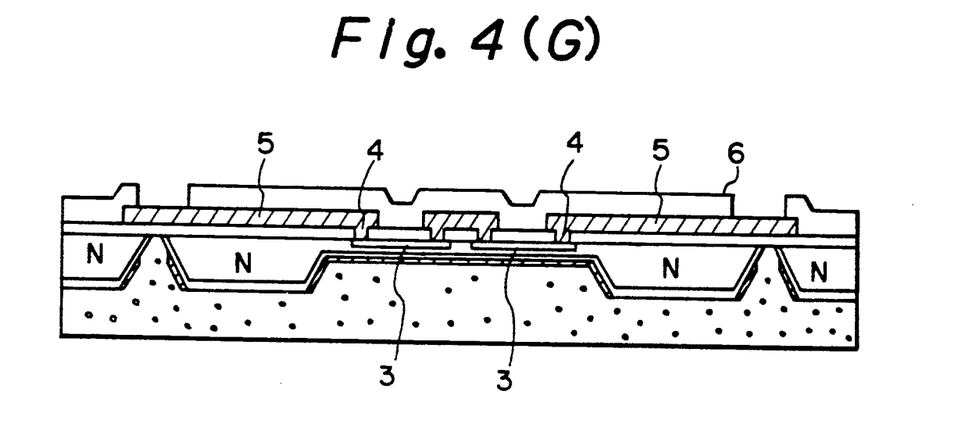

The steps of FIG. 4(D) to FIG. 4(G) are similar to the corresponding steps of the first Example shown in FIG. 1(C) to FIG. 1(F) except for the formation of the nitride film 50. Described in short, a polysilicon layer is formed on the substrate which has been processed through the steps shown in FIG. 4(A) to FIG. 4(C). The back surface is then polished off to the depth indicated by the broken line. As is depicted in FIG. 4(F), an oxide film 23 is formed. A diffused layer 3 for a piezo resistance element is thereafter formed as shown in FIG. 4(G), followed by the successive formation of an Al interconnection 5 and a passivation film 6.

Figure 4H:
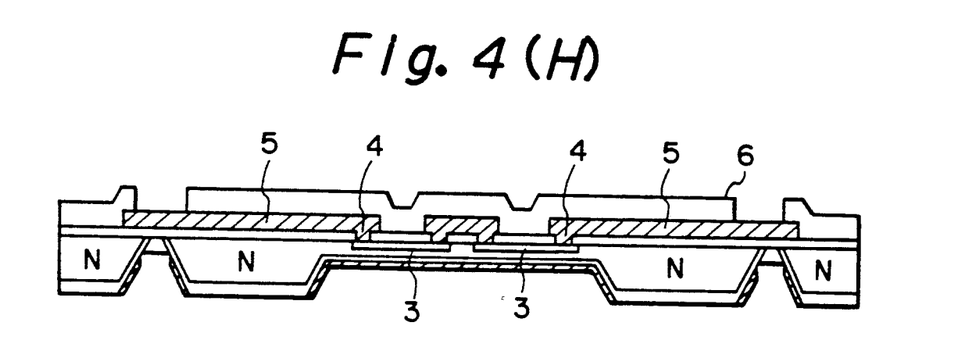

Reference is next made to FIG. 4(H). A resist resin or wax is coated on the surface of the substrate, in which surface the elements have been formed. Using the wax as a mask, the polysilicon layer 30 on the back surface of the substrate 1 is removed with the aforementioned alkaline etchant until the polysilicon in the recess 9 is eliminated.

A silica glass substrate may then be bonded to the surface of the substrate to protect the surface of the substrate.

Since the etching of the polysilicon layer 30 terminates at the nitride film 50, the silicon substrate 1 is not subjected to etching. Accordingly, the thickness of the diaphragm 9A formed as described above is equal to the depth d of the recess formed by the second etching upon formation of the alignment mark 10A. In the illustrated embodiment, the thickness of the diaphragm 9A becomes 35 μm.

Figure 4I:
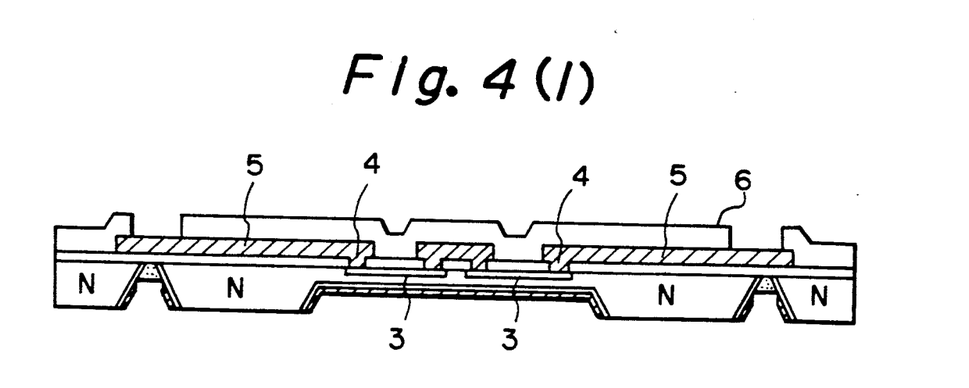

Reference is now had to FIG. 4(I), in which the oxide film 2 at a base for the diaphragm is etched off with an etchant of the hydrofluoric acid type through the nitride film 50 as a mask. The resist resin still remaining on the surface is thereafter removed, whereby a pressure sensor chip has been completed.

Owing to the above steps, the surface of the diaphragm is completed protected by the oxide film 21 and the nitride film 50 stacked together. Further, silicon is exposed on the surface of the base portion. Upon incorporation of the chip in a package, the silicon of the base portion therefore easily undergoes an eutectic reaction with the metal of the package. This permits die bonding.

FIG. 5(A) to FIG. 5(H) illustrate the fourth embodiment of the present invention, in which a pressure sensor and a bipolar semiconductor element are integrated on the same chip.

Figure 5A:
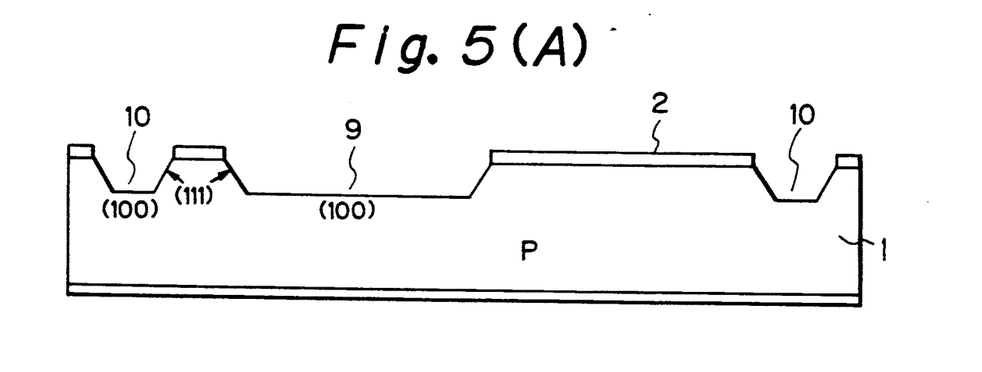
FIG. 5(A) to FIG. 5(H) are cross-sectional views depicting various steps of a fabrication process according to a fourth embodiment of the present invention.

The step depicted in FIG. 5(A) is exactly the same as the corresponding steps of the first and third embodiments except that the Si substrate is of the p-type.

Figure 5B:
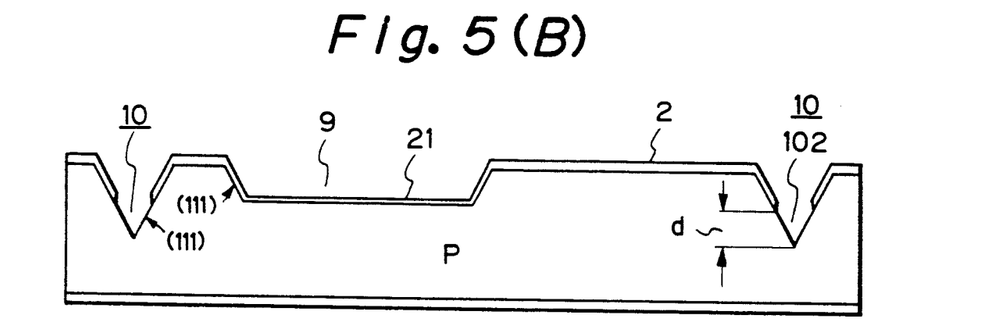

As is shown in FIG. 5(B), a silicon surface exposed on the substrate 1 is subjected to thermal oxidation again whereby a thermally oxidized film 21 of about 2000 Å in thickness is formed. By a known photolithoetching process, the oxide film 21 is then selectively removed in a bottom part of a recess 10 which is to be used to form an alignment mark. Thereafter, second silicon etching is similarly conducted using the thermally oxidized films 2,21 as masks. As a result, the (100) plane of the recess 10 is eliminated, leaving the recess 10 as a V-shaped recess whose wall is formed of (111) plane only.

Figure 5C:
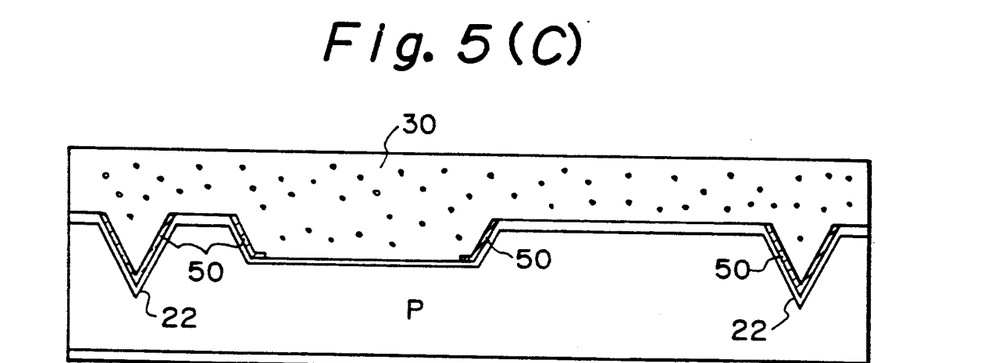

Next, as is depicted in FIG. 5(C), an oxide film 22 of about 2000 Å in thickness is again formed on a wall of the V-shaped recess 10, at which wall silicon is esposed. A nitride film (Si₃N₄) of about 800 Å in thickness is then formed by a CVD process on the entire surface of the substrate. The nitride film 50 is thereafter selectively etched by a known photolithoetching process so that the nitride film 50 is allowed to remain on the entire wall surface of the recess 10 and also on the side wall of the recess 9 which is to be used for the formation of diaphragm.

A polysilicon layer 30 is formed to a thickness of about 300 μm by a CVD process on the entire surface of the substrate. The surface with the polysilicon layer 30 formed thereon is then polished and smoothed to adjust the thickness from the substrate 1 to about 250 μm or so.

The CVD process used here can be the hydrogen reduction reaction of $SiH_2Cl_2$. The growth rate is controlled at approximately 2-5 μm/min.

Figure 5D:
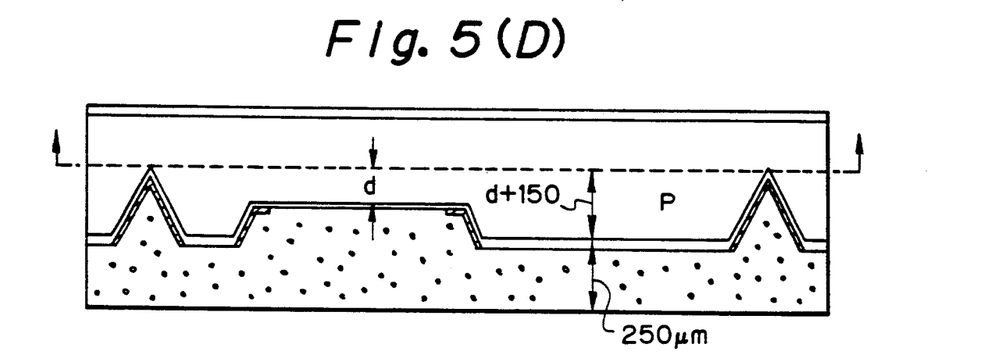

Similarly to the first and third embodiments, as is illustrated in FIG. 5(D), the back side on which the polysilicon layer 30 has been formed is polished off to the depth indicated by broken lines, namely until a part of the V-shaped alignment mark 10A appears. By this polishing, the thickness of the substrate is reduced to d (=35 μm) as depicted in FIG. 2. Its finish accuracy is about ±1.5 μm. At the other regions, the thickness of the substrate is d+150 μm=185 μm. The overall thickness of the substrate, including the polysilicon layer 30, is 435 μm.

Figure 5E:
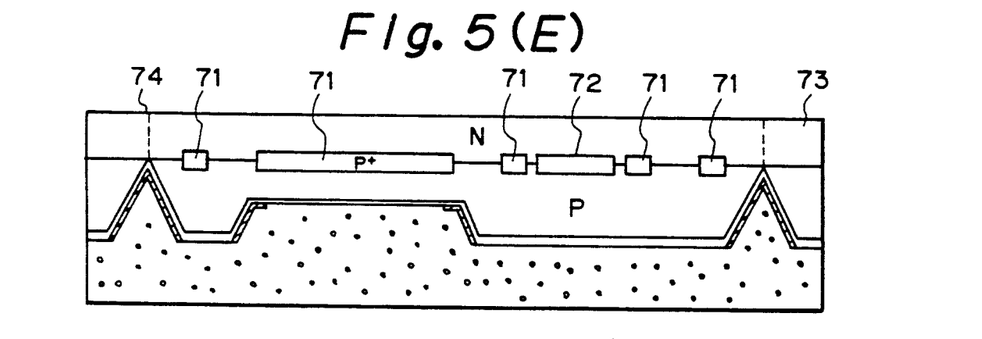

As is illustrated in FIG. 5(E), P+ buried layers 71 are next formed above the diaphragm 9A formed as described above and also in regions where isolation layers are to be formed in the next step, while an N+ buried layer 72 is formed in a region where a bipolar transistor is to be formed. These buried layers are formed by a known selective diffusion process in which the oxide film is used as a mask.

For example, each P+ buried layer 71 can be formed with a sheet resistance of about 200 Ω/□ and a junction depth of about 2 μm. On the other hand, the N+ buried layer can be formed with a sheet resistance of about 20 Ω/□ and a junction depth of about 4 μm. Here, the positions of the P+ buried layers 71 and the N+ buried layer 72 can be precisely determined relative to the diaphragm 9A by conducting their positioning while using ends 74 of the V-shaped alignment marks 10A.

The oxide film on the surface of the substrate is then removed. An n-type epitaxial layer 73 having a resistivity of approximately 2 Ωcm and a thickness of about 10 μm is thereafter formed. The ends 74 of the alignment marks 10A remain exposed in the surface of the epitaxial layer 73 during the growth of the epitaxial layer 73. The ends 74 of the alignment marks 10A can therefore be used as alignment marks in the subsequent steps. As an alternative, as is practiced in conventional fabrication processes of ICs, alignment marks can be renewed by using the steps formed upon formation of P+ buried layers 71 and the N+ buried layer 72.

Figure 5F:
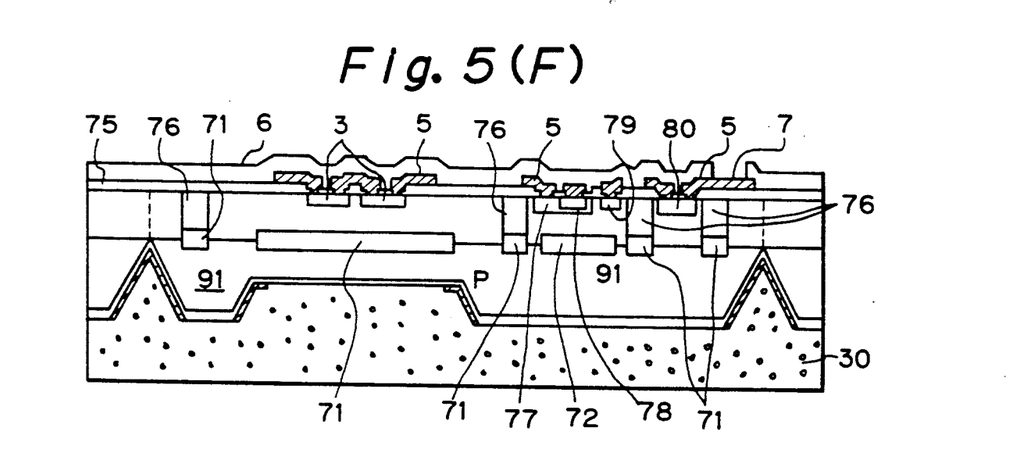

An oxide film 75 is formed on the epitaxial layer 73. As is shown in FIG. 5(F), isolation layers 76 are selectively formed in continuation with the corresponding P+ buried layers 77. Designated at numeral 3 is a diffused resistance layer which will function as a piezo resistance element. The diffused resistance layer 3 is arranged precisely at a predetermined position over the diaphragm 9A. Numerals 77,78,79 indicate diffused layers which form a base layer, an emitter layer and a collector of a bipolar transistor, respectively. Designated at numeral 80 is a diffused resistance for the formation of a circuit. They are all formed by selective diffusion. Contact holes are bored through the oxide film 75 at locations above the individual elements. Electrode interconnections 5, a passivation film 6 and a bonding pad 7 to be connected to a wiring are thereafter formed, whereby a piezo resistance element 200, an NPN bipolar transistor 300 and a diffused resistance element 400 have been completed. To protect the NPN bipolar transistor 300 and the diffused resistance 400 from any influence of pressures, they are arranged on a base 91 which is a thicker portion of the substrate [see FIG. 5(G)].

Figure 5G:
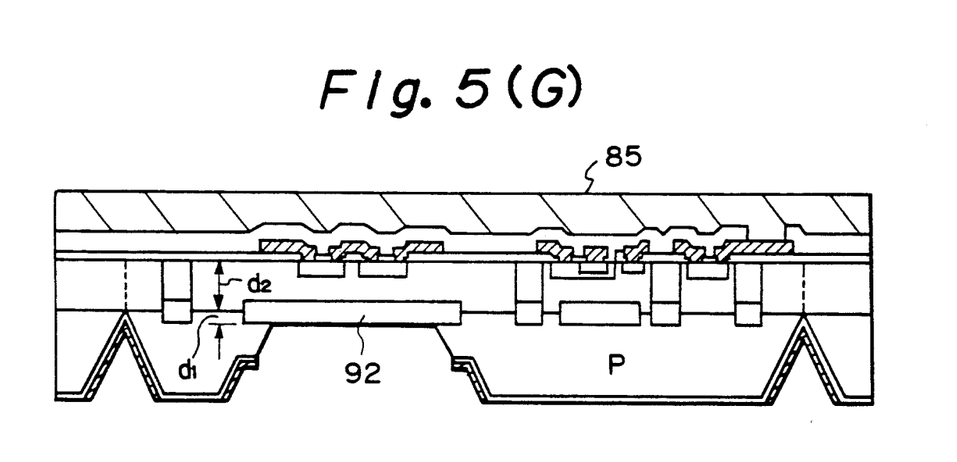

As is illustrated in FIG. 5(G), wax 85 is coated on the surface of the substrate 1 in which the above elements have been formed. Using the wax 85 as a masking material, the polysilicon layer 30 on the back surface of the substrate 1 is etched in the above-mentioned alkaline etchant until the polysilicon inside the recess 9 is eliminated.

Optionally, a silica glass substrate can be bonded to the surface of the substrate to protect it.

The etching of the polysilicon layer 30 terminates at the thermally-oxidized films 2,21 and the nitride film 50, so that the silicon substrate 1 is not etched. Accordingly, the thickness of the diaphragm 9A is equal to the depth d of the recess obtained by the second silicon etching upon formation of the alignment marks 10A. In the present embodiment, the thickness of the diaphragm 9A is 35 $\mu$m. Its accuracy is $\pm 1.5$ $\mu$m or so as described above.

Next, using the wax 85 and the nitride film 50 as masks, the thermally-oxidized film 21 of 2000 Å in thickness on the surface of the diaphragm 9A is etched off with an etchant of the hydrofluoric acid type. Here, the thermally-oxidized layer 2 is also etched. The thickness of the thermally-oxidized film 2 was 6000 Å or more, so that the remaining, thermally-oxidized film 2 has a thickness of at least 4000 Å.

Third silicon etching is then conducted with the above-described anisotropic alkaline etchant until the P+ buried layers 71 are reached. As etchants having etching rates which vary depending on the concentration of a dopant, etchants of the KOH type are known in the art. With such an etchant, the etching substantially stops when it has proceeded to the P+ buried layers 71, whereby a second diaphragm 92 is formed. The etching rate of suoh an etchant becomes extremely slow when the concentration of a P+ dopant is high. Since P+ buried layer 71 serves as a stopper, the thickness of the second diaphragm 92 is determined by the depth $d_1$ of diffusion of the P+ buried layer 71 and the thickness $d_2$ of the epitaxial layer. The accuracy of $d_1$ and $d_2$ is generally controlled within $\pm 5\%$ in fabrication processes of integrated circuits. Because $d_1$ and $d_2$ are, for example, 2 $\mu$m and 10 $\mu$m in the present embodiment, respectively, their variations fall within $\pm 0.6$ $\mu$m so that the thickness of the diaphragm is determined with extremely high accuracy.

Figure 5H:
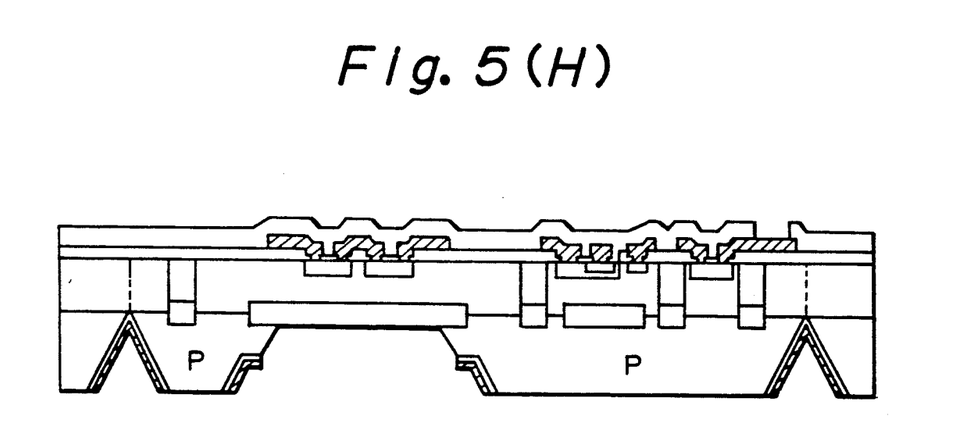

Reference is next made to FIG. 5(H). Using the wax 85 and the nitride film 50 as masks, the thermally-oxidized film 2 on the region of the base 91 for the diaphragm is etched off with an etchant of the hydrofluoric acid type. The wax 85 on the surface is then removed so that a pressure sensor chip has now been completed.

As a result, the silicon of the substrate is exposed at the surface of the base 91. Upon incorporation of the chip in a package, the silicon of the base 91 easily undergoes an eutectic reaction with the metal of the package so that die bonding is feasible.

In the present embodiment, the oxide film on the base 91 was removed. It is unnecessary to remove the oxide film provided that glass sealing or the like is applied.

What is claimed is:

1. A process for the fabrication of a semiconductor pressure sensor, which process comprises:
    i) forming a first recess having a first width and a second recess having a second width which is wider than the first width, in a first surface of a semiconductor substrate having the first surface and a second surface;
    ii) deepening the first recess so as to be deeper than the depth of the second recess, the depth of said first recess being determined by the first width;
    iii) forming a reinforcement layer for the semiconductor substrate on the first surface in which the first and second recesses are contained;
    iv) polishing the second surface until a part of the first recess appears on a side of the second surface; and
    v) forming a resistance element on a polished surface at a region opposing the second recess.

2. The process of claim 1, wherein the first recess is formed only in a (111) plane.

3. A process for the fabrication of a semiconductor pressure sensor, which process comprises the following steps:
    i) selectively removing a first insulating film formed on a semiconductor substrate;
    ii) forming a first recess and a second recess in the semiconductor substrate while using the remaining first insulating film as a mask;
    iii) forming a second insulating film over the substrate and removing the second insulating film in a bottom part of the first recess;
    iv) forming the first recess into a V-shaped cross-sectional shape while using the remaining second insulating film as a mask, whereby the first recess becomes deeper than the second recess;
    v) forming a third insulating film over the substrate and further a polysilicon layer on the third insulating film;
    vi) polishing a back side of the substrate, over which the polysilicon layer has been formed, until a part of the first recess is substantially exposed;
    vii) forming a fourth insulating film on the polished back side and, while using the part of the first recess as an alignment mark, selectively removing the fourth insulating film;
    viii) forming a diffused layer while using the remaining fourth insulating film as a mask;
    ix) forming a contact hole above the diffused layer, forming a conductive interconnection leading to the contact hole, and forming a passivation film on the conductive interconnection; and x) removing the polysilicon layer until the polysilicon inside the second recess is eliminated.

4. The process of claim 3, wherein the first recess is formed at a grid line region of the semiconductor substrate.

5. The process of claim 3, wherein the diffused layer is formed for the formation of a piezo resistance element.

6. A process for the fabrication of a semiconductor pressure sensor, which process comprises the following steps:
   i) forming a first insulating film on a surface of a semiconductor substrate and selectively removing the first insulating film;
   ii) forming a first recess and a second recess in the semiconductor substrate while using the remaining first insulating film as a mask;
   iii) forming a second insulating film over the substrate in which the first and second recesses are contained;
   iv) selectively etching the second insulating film so that the second insulating film in the whole second recess and on a side wall of the first recess is allowed to remain;
   v) forming the first recess into a V-shaped cross-sectional shape while using the remaining second insulating film as a mask, whereby the first recess becomes deeper than the second recess;
   vi) forming a third insulating film on the substrate and further a polysilicon layer on the entire surface of the third insulating film;
   vii) polishing a back surface of the semiconductor substrate until a part of the first recess is exposed;
   viii) forming a fourth insulating film on the thuspolished surface, selectively removing the fourth insulating film while using the thus-exposed part of the first recess as an alignment mark, and forming a diffused layer while using the remaining fourth insulating film as a mask;
   ix) forming a contact hole above the diffused layer, forming a conductive interconnection leading to the contact hole, and forming a passivation film on the conductive interconnection; and
   x) removing the polysilicon layer until the polysilicon inside the second recess is eliminated; and 7. The process of claim 6, wherein the first recess is formed at a grid line region of the semiconductor substrate.

8. The process of claim 6, wherein the diffused layer is formed for the formation of a piezo resistance element.

9. A process for the fabrication of a semiconductor device having a semiconductor pressure sensor, which comprises the following steps:
   i) selectively removing a first insulating film formed on a surface of a semiconductor substrate, and forming in the substrate a first recess for the formation of an alignment mark and a second recess for the formation of a diaphragm while using the remaining first insulating film as a mask;
   ii) forming a second insulating film over the substrate in which the first and second recesses are contained, selectively removing the second insulating film in a bottom part of the first recess becomes deeper than the second first recess into a V-shaped cross-sectional shape, whereby the first recess becomes deeper than the second recess;
   iii) forming a third insulating film over the substrate and further a polysilicon layer on the third insulating layer;
   iv) polishing a back surface of the substrate, on which the polysilicon layer has been formed, until a part of the first recess is exposed;
   v) forming a fourth insulating layer on the thuspolished surface, selectively removing the fourth insulating film while using the thus-exposed part of the first recess as an alignment mark, forming a diffused layer while using the remaining fourth insulating film as a mask, removing the remaining fourth insulating film, forming an epitaxial layer, and forming an element in the epitaxial layer;
   vi) removing the polysilicon layer until the polysilicon inside the second recess is eliminated; and
   vii) etching the bottom part of the second recess while using, as a mask, the third insulating film located inside the second recess.

10. The process of claim 9, wherein the first recess is formed at a grid line of the semiconductor substrate.

11. A process for the fabrication of a semiconductor pressure sensor, which comprises the following steps:
   i) preparing a semiconductor substrate having a first surface and a second surface opposite to the first surface;
   ii) forming first, second and third recesses, respectively, in first, second and third regions in the first surface of the semiconductor substrate, the first region being located intermediate between the second and the third regions;
   iii) forming a reinforcement layer for the semiconductor substrate on the first surface so as to cover the first, second and third recesses;
   iv) polishing the second surface so as to form a polished surface until a part of the second and third recesses are substantially exposed thereto; and
   v) forming a resistance element on the polished surface in a fourth region opposite to the first region.

12. The process of claim 11, wherein the reinforcement layer is formed with polysilicon.

13. The process of claim 11, wherein the resistance element is a piezo resistance element.

14. The process of claim 11, wherein the second and third recesses are formed at a grid line region of the semiconductor substrate.

15. A process for the fabrication of a semiconductor pressure sensore, which comprises the following steps:
   (i) preparing a semiconductor substrate having a first surface and a second surface opposite to the first surface;
   ii) forming first, second and third recesses, respectively, in first, second and third regions in the first surface of the semiconductor substrate, the first region being located intermediate between the second and the third regions;
   iii) forming a protective film on the first surface so as to cover the first, second and thrid recesses;
   iv) removing the protective film formed on at least a (100) plane in the second and third recesses;
   v) deepening the second and third recesses only in a (111) plane so that the second and third recesses become deeper than the first recess;
   vi) forming a reinforcement layer for the semiconductor substrate on the first surface so as to cover the first, second and third recesses;

vii) polishing the second surface so as to form a polished surface until a part of the second and third recesses are substantially exposed thereto; and viii) forming a resistance element on the polished surface in a fourth region opposite to the first region.

16. The process of claim 15, wherein the reinforcement layer is formed with polysilicon.

17. The process of claim 15, wherin the resistance elemtn is a piezo resistance element.

18. The process of claim 15, wherein the second and third recesses are formed at a grid line region of the semiconductor substrate.

19. A process for the fabrication of a semiconductor pressure sensor, which process comprises:
   i) preparing a semiconductor substrate having a first surface and a second surface opposite to the first surface;
   ii) forming first, second and third recesses, respecitively, in first, second and third regions in the first surface of the semiconductor substrate, the first region being located intermediate between the second and the third regions, the depth of the second recess being substantially equal to that of the third recess and deeper than that of the first recess;
   iii) forming a reinforcement layer for the semiconductor substrate on the first surface so as to cover the first, second and third recesses;
   iv) polishing the second surface so as to form a polished surface until a part of the second and third recesses are substantially exposed thereto; and
   v) forming a resistance element on the polished surface in a fourth region opposite to the first region.

20. The process of claim 19, wherein the reinforcement layer is formed with polysilicon.

21. The process of claim 19, wherein the resistance element is a piezo resistance element.

22. The process of claim 19, wherin the second and third recesses are formed at a grid line region of the semiconductor substrate.

* * * * *